(12) United States Patent
Huo (10) Patent No.: US 10,373,968 B2
(45) Date of Patent: Aug. 6, 2019

(54) 3-D SEMICONDUCTOR DEVICE AND METHOD FOR MANUFACTURING THE SAME

(71) Applicant: Institute of Microelectronics, Chinese Academy of Sciences, Chaoyang, District, Bejing (CN)

(72) Inventor: Zongliang Huo, Bejing (CN)

(73) Assignee: Institute of Microelectronics, Chinese Academy of Sciences (CN)

( * ) Notice: Subject to any disclaimer, the term of this patent is extended or adjusted under 35 U.S.C. 154(b) by 0 days.

(21) Appl. No.: 15/306,179

(22) PCT Filed: Jul. 10, 2014

(86) PCT No.: PCT/CN2014/081926
§ 371 (c)(1),
(2) Date: Oct. 24, 2016

(87) PCT Pub. No.: WO2015/161569
PCT Pub. Date: Oct. 29, 2015

(65) Prior Publication Data
US 2017/0047340 A1    Feb. 16, 2017

(30) Foreign Application Priority Data
Apr. 24, 2014  (CN) .......................... 2014 1 0169315

(51) Int. Cl.
H01L 27/11556    (2017.01)
H01L 29/10       (2006.01)
H01L 29/788      (2006.01)
H01L 27/11582    (2017.01)
H01L 29/792      (2006.01)

(52) U.S. Cl.
CPC .... H01L 27/11556 (2013.01); H01L 29/1037 (2013.01); H01L 29/7887 (2013.01); H01L 29/7889 (2013.01); H01L 27/11582 (2013.01); H01L 29/7926 (2013.01)

(58) Field of Classification Search
CPC .......... H01L 27/11556; H01L 29/1037; H01L 27/11582; H01L 29/7926
See application file for complete search history.

(56) References Cited

U.S. PATENT DOCUMENTS

| 2009/0310425 | A1  | 12/2009 | Sim et al. |
| 2011/0018036 | A1  | 1/2011  | Hwang et al. |
| 2011/0101443 | A1* | 5/2011  | Huo ................ H01L 27/11551 257/324 |

(Continued)

*Primary Examiner* — Robert T Huber
*Assistant Examiner* — Xia L Cross
(74) *Attorney, Agent, or Firm* — Dickinson Wright PLLC (57) ABSTRACT

A 3-D semiconductor device comprising a plurality of memory cells and a plurality of selection transistors, each of said plurality of memory cells comprises: a channel layer, distributed along a direction perpendicular to the substrate surface; a plurality of inter-layer insulating layers and a plurality of gate stack structures, alternately laminating along the sidewall of the channel layer; a plurality of floating gates, located between the plurality of inter-layer insulating layers and the sidewall of the channel layer; a plurality of drains, located at the top of the channel layer; and a plurality of sources, located in the said substrate between two adjacent memory cells of the said plurality of memory cells.

8 Claims, 5 Drawing Sheets

(56) References Cited

U.S. PATENT DOCUMENTS

2012/0276696 A1* 11/2012 Yang ................ H01L 27/11556
                                                    438/156
2013/0049095 A1*  2/2013 Whang ............... H01L 29/7889
                                                    257/321
2014/0063985 A1   3/2014 Joo

* cited by examiner

3-D SEMICONDUCTOR DEVICE AND METHOD FOR MANUFACTURING THE SAME

CROSS-REFERENCE TO RELATED APPLICATIONS

The present application is a 35 U.S.C. Section 371 national stage filing of International Patent Application No. PCT/CN2014/081926, filed 10 Jul. 2014, and through which priority is claimed to Chinese Patent Application 201410169315.9, filed 24 Apr. 2014, the disclosures of which are incorporated herein by reference in their entireties.

This application is a National Phase application of, and claims priority to, PCT Application No. PCT/CN2014/081926, filed on Jul. 10, 2014, entitled "3-D Semiconductor Device and method for manufacturing the same", which claimed priority to Chinese Application No. 201410169315.9, filed on Apr. 24, 2014. Both the PCT Application and Chinese Application are incorporated herein by reference in their entireties.

TECHNICAL FIELD

The present invention relates to a semiconductor device and a method for manufacturing the same, particularly to a three-dimensional semiconductor device and a method for manufacturing the same.

BACKGROUND

In order to improve the density of the memory device, the industry has worked extensively at developing a method for reducing the size of the two-dimensional arranged memory cells. As the size of the memory cells of the two-dimensional (2D) memory devices continues to shrink, signal conflict and interference will significantly increase, so that it is difficult to perform operation of multi-level cell (MLC). In order to overcome the limitations of 2D memory device, the industry has developed a memory device having a three-dimensional (3D) structure, by way of the memory cell arranged three-dimensionally on the substrate to improve the integration density.

Specifically, a multilayer laminated structure (e.g., a plurality of ONO structures of alternating oxide and nitride) may firstly deposited on the substrate; by an anisotropic etching process for etching the multilayer laminated structure on the substrate, a plurality of channel through-holes distributed along the word line (WL) of memory cell extending direction and perpendicular to the substrate surface are formed (may extend through to the substrate surface or even with a certain over-etch); a plurality of pillar-shaped channels are formed in the channel through-holes by depositing polysilicon material; the multilayer laminated structure is etched along the WL direction to form a plurality of trenches through to the substrate, exposing the multilayer stack surrounding the pillar-shaped channels; a certain type of materials in the stack is removed by wet etching (e.g., using hot phosphoric acid to remove nitrogen silicon, or HF to remove silicon oxide), leaving a plurality of projecting structures lateral distributed around the pillar-shaped channels; a gate dielectric layer (such as high-k dielectric materials) and a gate conductive layer (e.g., Ti, W, Cu, Mo, etc.) are deposited on the side walls of the projecting structures in the trenches to form a gate stack; the portion of the gate stack above the lateral plane of the projecting structures is removed by vertical anisotropic etching until the gate dielectric layer on the side of the projecting structures is exposed; the laminated structure is etched to form a plurality of source/drain contacts, and rear end of the manufacturing processes are completed. Here, a portion of projecting structures of the laminated structure which is left on the sidewall of pillar-shaped channels forms a plurality of spacers between the gate electrodes, while the gate stacks sandwiched between the spacers form the control electrodes. When a voltage is applied to the gates, the fringe field of the gate will enable a plurality of source-drain regions to be formed on the sidewalls of pillar-shaped channels made of e.g. polysilicon material, thereby constituting a gate array composed of a plurality of series-parallel connected MOSFETs so as to record the stored logic states.

As the device size has further reduced to e.g. 22 nm, and even 10 nm mode, the resistance of channel region composed of polysilicon materials increased significantly, the method and device structure of applying a voltage to the gate to induce source-drain regions in channel region are facing the problems of reduced induction efficiency, decreased induction intensity, and increased series resistance, which directly affects the read current and read speed of memory array. In extreme cases, the potential at a node being remote from the memory cell read node (e.g., the bit line BL on the top of a stack structure or the metal silicide of source region in substrate) may be insufficient to generate inductively the source-drain regions in the channel region, thereby causing the entire memory cells fails, and the data cannot be read.

SUMMARY

From the above, the object of the invention is to overcome the above-mentioned technical difficulties by proposing an innovative 3-D semiconductor device and method for manufacturing the same.

According to one aspect of the present invention, it provides a 3-D semiconductor device comprising a plurality of memory cells and a plurality of selection transistors, each of said plurality of memory cells comprises: a channel layer, distributed along a direction perpendicular to the substrate surface; a plurality of inter-layer insulating layers and a plurality of gate stack structures, alternately laminating along the sidewall of the channel layer; a plurality of floating gates, located between the plurality of inter-layer insulating layers and the side of the sidewall of the channel layer; a drain, located at the top of the channel layer; and a plurality of sources, located between two adjacent memory cells of the said plurality of memory cells in the said substrate.

Wherein, the material of said channel layer comprises monocrystal silicon, amorphous silicon, polycrystalline silicon, microcrystalline silicon, monocrystal germanium, SiGe, Si:C, SiGe:C, SiGe:H, and combinations thereof.

Wherein, the cross-sectional shape of the channel layer parallel to the substrate surface comprises geometric shapes selected from rectangular, square, diamond, circular, semicircular, elliptical, triangular, pentagonal, hexagonal, octagonal and the combinations thereof, and includes those selected from solid geometry, hollow annular geometry, or a combination of a hollow annular peripheral layer and a central insulating layer as a result of revolution of geometric shapes.

Wherein, the materials of said plurality of inter-layer insulating layers include silicon oxide, silicon nitride, amorphous carbon, amorphous diamond-like carbon (DLC), germanium oxide, aluminum oxide, aluminum nitride, and combinations thereof.

Wherein, each of said plurality of gate stack structures includes a gate dielectric layer and a gate conductive layer. Wherein, the gate dielectric layer further comprises a tunneling layer, a storage layer, and a barrier layer. Wherein, the tunneling layer comprises a monolayer or multilayer structure made of $SiO_2$, high-k materials and combinations thereof; wherein, the high-k materials include, but are not limited to nitrides selected from SiN, AlN, TiN and combinations thereof, metal oxides selected from MgO, $Al_2O_3$, $Ta_2O_5$, $TiO_2$, ZnO, $ZrO_2$, $HfO_2$, $CeO_2$, $Y_2O_3$, $La_2O_3$, and combinations thereof, nitrogen oxides, and perovskite phase oxide selected from PZT, BST and combinations thereof. Wherein, said storage layer comprises a monolayer or multilayer structure having a dielectric material with charge trapping capability, the dielectric material is selected from SiN, HfO, ZrO, and combinations thereof. Wherein, said barrier layer comprises a monolayer or multilayer structure made of dielectric material selected from silicon oxide, aluminum oxide, hafnium oxide and combinations thereof.

Wherein, the gate conductive layer comprises a monolayer or multilayer structure made of conductive material, said conductive material comprises polysilicon, polycrystalline germanium-silicon, or a metal, an alloy of the metal or a nitride of the metal, wherein said metal comprises metal selected from Co, Ni, Cu, Al, Pd, Pt, Ru, Re, Mo, Ta, Ti, Hf, Zr, W, Ir, Eu, Nd, Er, La and combinations thereof.

Wherein, a barrier layer of nitride between the gate dielectric layer and the gate conductive layer is further included, the nitride is $M_xN_y$, $M_xSi_yN_z$, $M_xAl_yN_z$, $M_aAl_xSi_yN_z$, wherein the M is Ta, Ti, Hf, Zr, Mo, W, and combinations thereof, and the x, y are both greater than or equal to 0 and less than or equal to 1.

Wherein, the plurality of floating gates comprise a monolayer or multilayer structure of floating gate material layer; wherein, the material of floating gate material layer comprises a semiconductor material selected from monocrystal silicon, amorphous silicon, polycrystalline silicon, microcrystalline silicon, monocrystal germanium, SiGe, Si:C, SiGe:C, SiGe:H and combinations thereof, or comprises a conductive material selected from a metal, a nitride of the metal, and a silicide of the metal, wherein the said metal is selected from Al, Co, Ni, Cu, Pd, Pt, Ru, Re, Mo, Ta, Ti, Hf, Zr, W, Ir, Eu, Nd, Er, La and combinations thereof, or comprises a dielectric material with charge trapping capability selected from SiN, HfO, ZrO, and combinations thereof.

Wherein, a floating gate spacer between each of the plurality of the floating gate and the channel layer and/or the gate stack structures is further included.

Wherein, each top of the plurality of sources comprises a metal silicide.

Wherein, said plurality of selection transistors may or may not include a floating gate.

In another aspect of the invention, there is provided a method of manufacturing a 3-D semiconductor device, comprising the steps of: forming a stack structure composed of a first plurality of material layers and a second plurality of material layers on a substrate of memory cell region; forming a plurality of trenches by etching the stack structure; forming a plurality of recesses on sidewall of the plurality of trenches in the first plurality of material layers or the plurality of second material layers by selective etching; forming a plurality of floating gates and a plurality of a floating gate spacers in the plurality of recesses.

Wherein, said first, second plurality of material layer is selected from one of the following materials or a combination of: silicon oxide, silicon nitride, polycrystalline silicon, amorphous silicon, microcrystalline silicon, amorphous carbon, amorphous diamond-like carbon (DLC), germanium oxide, aluminum oxide, aluminum nitride, metals, metal alloys, metal nitrides.

Wherein, the plurality of floating gates comprise a monolayer or multilayer structure of floating gate material layer; wherein, the material of floating gate material layer comprises a semiconductor material selected from monocrystal silicon, amorphous silicon, polycrystalline silicon, microcrystalline silicon, monocrystal germanium, SiGe, Si:C, SiGe:C, SiGe:H and combinations thereof, or comprises a conductive material selected from a metal, a nitride of the metal, and a silicide of the metal, wherein the said metal is selected from Al, Co, Ni, Cu, Pd, Pt, Ru, Re, Mo, Ta, Ti, Hf, Zr, W, Ir, Eu, Nd, Er, La and combinations thereof, or comprises a dielectric material with charge trapping capability selected from SiN, HfO, ZrO, and combinations thereof.

Wherein, prior to and/or after forming the plurality of floating gates, forming said floating gate spacers.

Wherein, the said floating gate spacers are formed by performing a deposition process on the sidewalls and/or bottom of the plurality of floating gates, or by performing an oxidation or nitridation process on the plurality of floating gates.

Wherein, said first, second plurality of material layer are made of a insulating material having a different etching selectivity. After forming the plurality of floating gates, there are further comprised: forming a plurality of channel layers in the plurality of trenches; forming a plurality of drains by filling the top of plurality of channel layers; removing a portion of the first, second plurality of material layers in which the plurality of recesses or floating gates are not formed by selective etching, leaving a plurality of lateral trenches; forming a plurality of gate stack structure composed of a gate dielectric layer and a gate conductive layer in the plurality of lateral trenches; forming a plurality of sources in the substrate.

Wherein, the gate dielectric layer further comprises a tunneling layer, a storage layer, and a barrier layer. Wherein, the tunneling layer comprises a monolayer or multilayer structure made of $SiO_2$, high-k materials and combinations thereof; wherein, the high-k materials include, but are not limited to nitrides selected from SiN, AlN, TiN and combinations thereof, metal oxides selected from MgO, $Al_2O_3$, $Ta_2O_5$, $TiO_2$, ZnO, $ZrO_2$, $HfO_2$, $CeO_2$, $Y_2O_3$, $La_2O_3$ and combinations thereof, nitrogen oxides, and perovskite phase oxide selected from PZT, BST and combinations thereof. Wherein, said storage layer comprises a monolayer or multilayer structure having a dielectric material with charge trapping capability, the dielectric material is selected from SiN, HfO, ZrO, and combinations thereof. Wherein, said barrier layer comprises a monolayer or multilayer structure made of dielectric material selected from silicon oxide, aluminum oxide, hafnium oxide and combinations thereof.

Wherein, the gate conductive layer comprises a monolayer or multilayer structure made of conductive material, said conductive material comprises polysilicon, polycrystalline germanium-silicon, or a metal, an alloy of the metal or a nitride of the metal, wherein said metal comprises metal selected from Co, Ni, Cu, Al, Pd, Pt, Ru, Re, Mo, Ta, Ti, Hf, Zr, W, Ir, Eu, Nd, Er, La and combinations thereof. Wherein, a barrier layer of nitride between the gate dielectric layer and the gate conductive layer is further included, the nitride is $M_xN_y$, $M_xSi_yN_z$, $M_xAl_yN_z$, $M_aAl_xSi_yN_z$, wherein the M is Ta, Ti, Hf, Zr, Mo, W, and combinations thereof, and the x, y are both greater than or equal to 0 and less than or equal to 1.

Wherein, one of said first, second plurality of material layers with recesses formed therein are made of insulating material, and the other without recesses formed therein are made of semiconductor or conductive material. After forming the floating gates, there is further comprised: forming a gate insulating layer on sidewall of the first or second plurality of material layer without recesses formed therein, constituting a gate stack structure along with the first or second plurality of material layer without recesses formed therein; forming a plurality of channel layers in the recesses on the gate stack structure; forming a plurality of drains on top of the plurality of channel layers; and forming a plurality of sources in the substrate.

Wherein, the material of channel layers comprises monocrystal silicon, amorphous silicon, polycrystalline silicon, microcrystalline silicon, monocrystal germanium, SiGe, Si:C, SiGe:C, SiGe:H, and combinations thereof.

Wherein, the cross-sectional shape of the channel layer parallel to the substrate surface comprises geometric shapes selected from rectangular, square, diamond, circular, semi-circular, elliptical, triangular, pentagonal, pentagonal, hexagonal, octagonal and the combinations thereof, and includes those selected from solid geometry, hollow annular geometry, or a combination of a hollow annular peripheral layer and a central insulating layer as a result of revolution of geometric shapes.

In accordance with the 3-D semiconductor device and manufacturing method of the present invention, by ways of implanting floating gates in the vertical channel sidewalls and controlling the on/off of source-drain regions induced on the vertical channel sidewalls by coupling between the gate electrodes and the floating gates, the induction efficiency and induction strength of source-drain regions are effectively improved, the source-drain resistance of memory cells is reduced, thereby the read current and read speed of memory array are increased.

BRIEF DESCRIPTION OF THE DRAWINGS

Referring to the following drawings, the technical solutions of the present invention are described in detail, in which.

DETAILED DESCRIPTION

The features and technical effects of the present invention will be described in detail with reference to the drawings and schematic embodiments, disclosing a method for manufacturing a semiconductor device effectively improving the reliability of the device. It should be noted that the similar reference numbers denote the similar structure. The terms used in the present invention like "first", "second", "up/upon", "down/low/beneath/under" etc. can be used in denoting various device structures, and do not indicate the relationship in space, sequence or hierarchy of the device structures unless specially illuminated these terms, if not stated otherwise.

Figure 1:
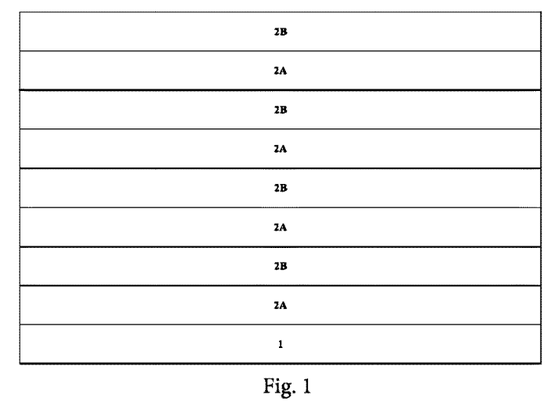
FIG. 1 to 10 are cross-sectional views of the various steps of the 3-D semiconductor device manufacturing method in accordance with an embodiment of the present invention.

As shown in FIG. 1, a stack structure 2 is formed on the substrate 1 by the way of alternately forming a first material layers 2A and a second material layers 2B. The material of substrate 1 may comprise a bulk silicon (bulk Si), bulk germanium (bulk Ge), silicon-on-insulator (SOI), germanium-on-insulator (GeOI), or other compound semiconductor substrate, e.g., SiGe, SiC, GaN, GaAs, InP and the like, or combinations of these substances. For compatibility with the existing IC fabrication process, in an embodiment, the substrate 1 contains silicon material, e.g., Si, SOI, SiGe, Si:C and the like. The material of the stack structure 2 is selected from combination of the following material and comprises at least one insulating dielectric: e.g. silicon oxide, silicon nitride, polycrystalline silicon, amorphous silicon, amorphous carbon, amorphous diamond-like carbon (DLC), germanium oxide, aluminum oxide, aluminum nitride, metals or the like and combinations thereof. The first material layer 2A has a first etch selectivity, while the second material layer 2B has a second etch selectivity which is different from the first etch selectivity. In one preferred embodiment of the invention, laminate structure 2A/2B are both insulating material, and the combination of layers 2A/2B is a combination of silicon oxide and silicon nitride, a combination of silicon oxide and polysilicon or amorphous silicon, a combination of silicon oxide and silicon nitride or amorphous carbon and the like, and etc. In another preferred embodiment of the invention, both the layer 2A and layer 2B have a relatively great etching selectivity at wet etching conditions or oxygen plasma dry etching conditions (for example greater than 5:1). The method for depositing layer 2A, 2B comprises PECVD, LPCVD, HDPCVD, MOCVD, MBE, ALD, thermal oxidation, evaporation, sputtering, and other processes.

Figure 2:
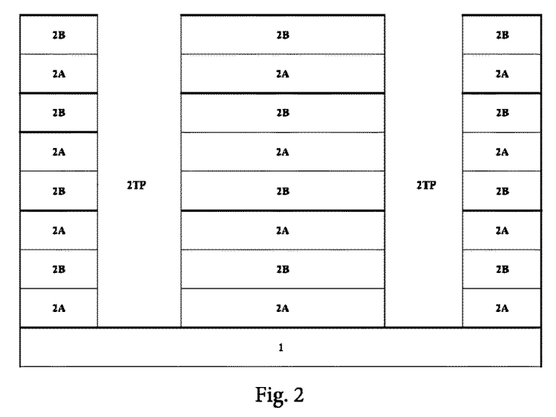

As shown in FIG. 2, the stack structure 2 is etched through till the substrate 1 is exposed, forming a plurality of trenches 2TP vertically punching through the stack structure and used to define the channel regions. In an embodiment, the stack structure 2 of layers 2A/2B is anisotropically etched by RIE or plasma dry etching, exposing the substrate 1 and the sidewalls of layers 2A/2B which are alternately laminated on the substrate 1. In an other embodiment, the process conditions of anisotropic etching of stack structure 2 are controlled in order to make the lateral etching rate being significantly less than the longitudinal etching rate, obtaining a vertical deep hole or deep trenches 2TP with high aspect ratio (e.g., aspect ratio AR being greater than or equal to 10:1). The cross-sectional shape by cutting parallel to the surface of substrate 1 may be various geometric shapes selected from rectangular, square, diamond, circular, semi-circular, elliptical, triangular, pentagonal, hexagonal, octagonal, and etc.

Figure 3:
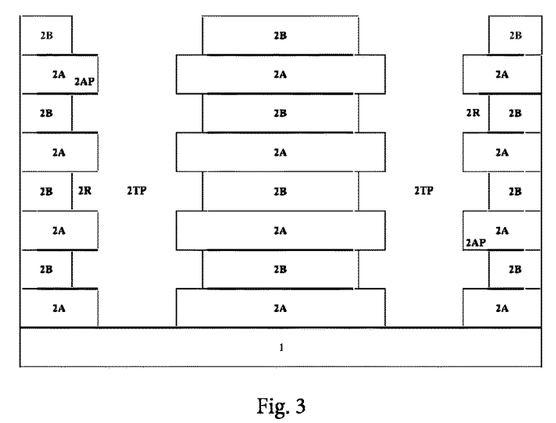

As shown in FIG. 3, the second material layers 2B in the stack structure 2 are selectively etched (e.g. etched back), forming a plurality of recesses 2R in the side wall of the trenches 2TP for later defining the floating gates area. Etching methods include wet etching and dry etching. Depending on the difference between material of layers 2A and layers 2B, the selectable wet etching solution comprises HF base etchant for silicon oxide material, hot phosphoric acid etchant for silicon nitride material, strongly alkaline etchant such as KOH or TMAH for the polysilicon or amorphous silicon material. Furthermore, oxygen plasma dry etching can be chosen for carbon-based materials such as amorphous carbon or DLC, making O and C react to form gases to be exhausted. The recesses 2R can either be the recesses with respect to the layers 2A which are obtained by etching layers 2B (i.e., layers 2A having protrusions 2AP with respect to layers 2B) as shown in FIG. 3, or can be the recesses with respect to the layers 2B which are obtained by etching layers 2A which are different from those shown in FIG. 3.

Figures 4, 5:
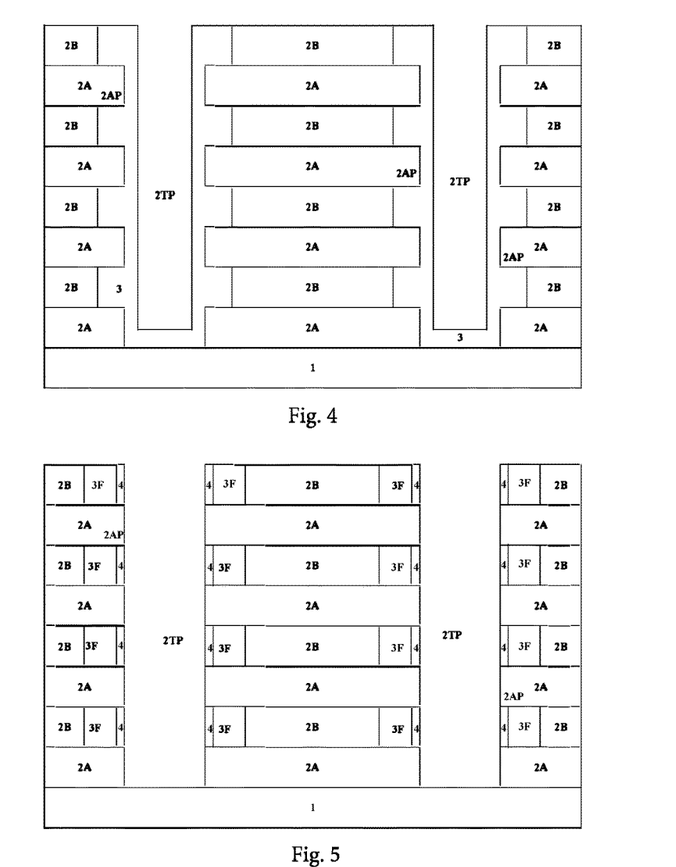

As shown in FIG. 4, a floating gate material layer 3 is deposited in the bottom and on the sidewalls of the trenches 2TP along with on the sidewalls of recesses 2R. The material of floating gate material layer 3 may include semiconductor material such as monocrystal silicon, amorphous silicon, polycrystalline silicon, microcrystalline silicon, monocrystal germanium, SiGe, Si:C, Si:H, etc. (may be in-situ doped); or may include conductive material such as metal, metal nitride, metal silicide, wherein the metal may be selected from Al, Co, Ni, Cu, Pd, Pt, Ru, Re, Mo, Ta, Ti, Hf, Zr, W, Ir, Eu, Nd, Er, La, and etc., and combinations thereof; moreover, the floating gate material layer 3 may also be a dielectric material which has charge trapping capabilities, such as SiN, HfO, ZrO, etc. Although floating gate material layer 3 shown in FIG. 4 is a monolayer structure, in other embodiments of the present invention it may be a combination of the above-described materials, the combination styles comprise stack, mixed, embedded, alloy, etc., and the layer 3 may be either monolayer structure or a multilayer stacked structure. The deposition process of layer 3 includes PECVD, HDPCVD, MOCVD, MBE, ALD, evaporation, sputtering, etc., and the process of depositing firstly occurs in the recesses 2R, completely filling a plurality of recesses 2R on the side walls of the trenches 2TP, and then continuing to fill the bottom and sidewalls of trenches 2TP. In one embodiment of the invention, the deposited layer 3 may completely or partially fills the trenches 2TP (as shown in FIG. 4).

As shown in FIG. 5, a plurality of floating gates 3F and optional a plurality of floating gate spacers 4 are formed on the sidewalls of trenches 2TP. The floating gate material layer 3 is anisotropically etched until the protruding portions of stacked structure 2, i.e. the outermost portions of recesses 2R (corresponding to sidewall projecting portion 2BP of layer 2B in FIG. 3) is exposed, leaving a plurality of floating gates 3F in the recesses 2R. When the material of floating gate material layer 3 is a dielectric material with charge trapping capabilities, the floating gate spacers 4 can be substituted with the outermost of layer 3 in recesses 2R instead of additionally forming the plurality of floating gate spacers 4. When the material of floating gate material layer 3 is other (preferably doped) semiconductor material or metal-based conductive material, the plurality of floating gate spacers 4 can be formed additionally on the sidewalls of floating gates 3F by performing thermal oxidation, nitriding process or various deposition process described above. The material of floating gate spacers 4 may be a corresponding oxide or nitride of the material of the floating gate material layer 3, such as silicon oxide, germanium oxide, silicon germanium oxide, titanium oxide, tantalum oxide, hafnium oxide, zirconium oxide, and silicon nitride, germanium and so on.

Figure 6:
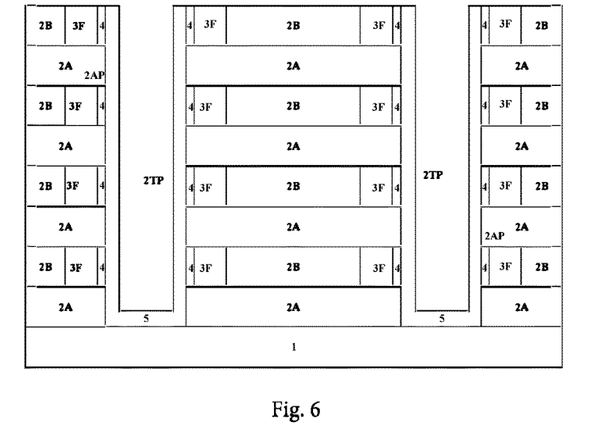

As shown in FIG. 6, a plurality of channel layers 5 are formed on the sidewalls of floating gates 3F and optional floating gate spacers 4, along with the bottom of trenches 2TP and on the surface of the substrate 1. The material of the channel layers 5 may include semiconductor material, such as monocrystal silicon, amorphous silicon, polycrystalline silicon, microcrystalline silicon, monocrystal germanium, SiGe, Si:C, SiGe:C, SiGe:H etc., formed by the deposition process described above. In one embodiment of the present invention shown in FIG. 6, the deposition process of channel layers 5 is partially filling the sidewalls of trenches 2TP to form hollow cylinders with air gaps. In other embodiments of the present invention not shown, the deposition process of channel layers 5 is chosen to completely or partially filling the trenches 2TP, thereby forming a plurality of solid columns, hollow rings, or core-shell structures having hollow rings with filled insulating layer (not shown). The shape of the horizontal cross section of channel layers 5 is similar or preferably conformal to those of trenches 2TP, and can be various solid geometric shapes, such as rectangle, square, diamond, circular, semi-circular, elliptical, triangular, pentagonal, pentagonal, hexagonal, octagonal etc., or annular or tubular hollow structures evolved from geometric shapes described above (and its interior may be filled with insulating layers).

Figure 7:
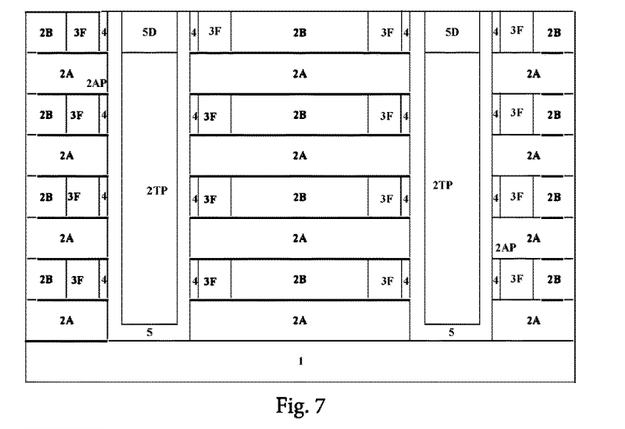

As shown in FIG. 7, a plurality of drain regions 5D are further formed on top of trenches 2TP by filling process. Preferably, the drains 5D of memory cell transistors are formed by depositing materials as the same or similar to those of channel layers 5 (e.g., materials similar to Si, such as SiGe, SiC, etc., in order to fine-tune the lattice constants and improve the carrier mobility, thereby controlling the driving performance of cell components) on top of trenches 2TP. Naturally, if the channel layers 5 are solid structures filled completely which is different from those shown in FIG. 6, the steps shown in FIG. 7 may be skipped over, and the portions of channel layers 5 on the top of whole device constitutes the corresponding drain regions 5D.

Figure 8:
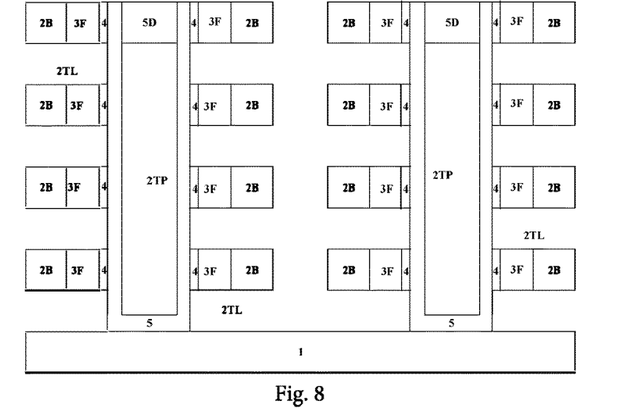

As show in FIG. 8, the first plurality of material layers 2A is removed by selective etching, leaving a plurality of lateral recesses 2TL between the second plurality of material layers 2B, wherein the upper and lower surfaces of recesses 2TL are contacted with the second plurality of material layers 2B, one side surface of recesses 2TL is contacted with channel layers 5 and the other is exposed to the air, and the surface of substrate 1 is simultaneously exposed. Preferably, wet etching is utilized, for instance, using HF-based etchant for silicon oxide material, hot phosphoric acid etchant for silicon nitride material, or strongly alkaline etchant such as KOH or TMAH for polysilicon or amorphous silicon material. In one embodiment of the present invention, the layers 2B are silicon oxide, and in the step as shown in FIG. 8, the layers 2A are silicon nitride layer, so that hot phosphoric acid etchant is utilized to remove layers 2A of silicon nitride. In addition, in other embodiments, various above-mentioned wet etchants may be employed to remove the respective the first plurality of material layers 2A. Further, in other embodiments of the present invention, when the layers 2A are made of amorphous carbon or DLC material, they can be removed by oxygen plasma dry etching. The remain portions of the second plurality of material layers 2B are used later as interlayer insulating layer 2B between the gate stacks.

Figure 9:
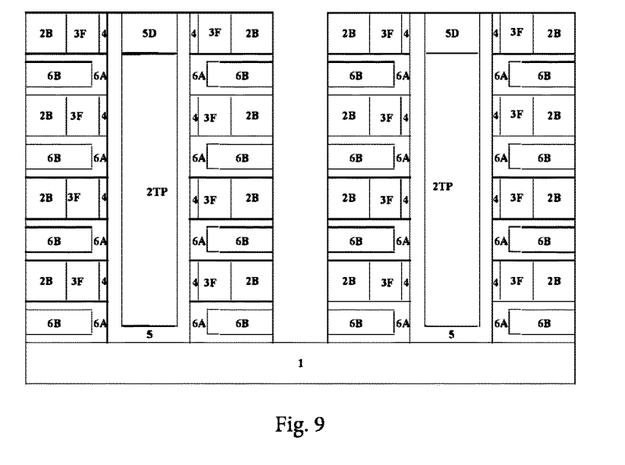
Figure 11:
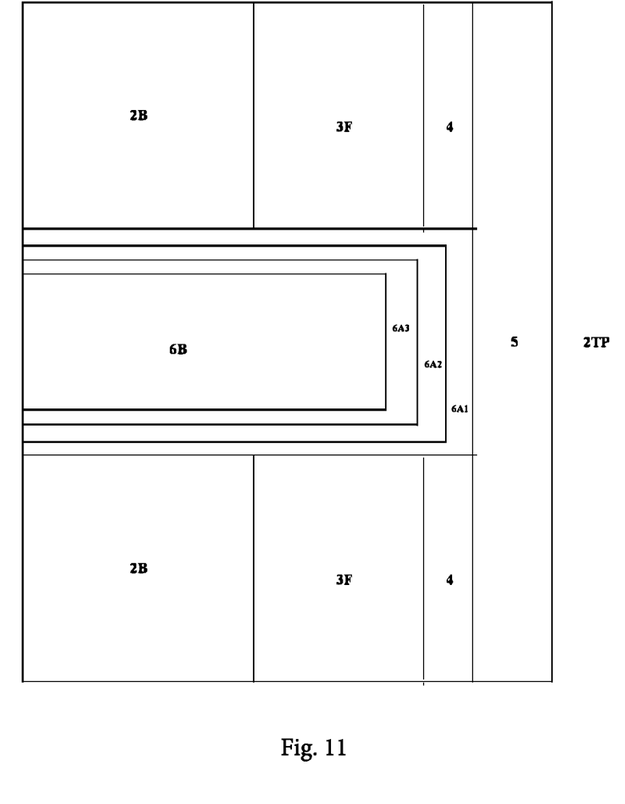
FIG. 11 is an enlarged schematic diagram of vicinity of the floating gates shown in FIG. 9 or 10.

As shown in FIG. 9, a plurality of gate stack structures 6 composed of gate dielectric layers 6A and gate conductive layers 6B are formed in the recesses 2TL. Deposition methods include PECVD, HDPCVD, MOCVD, MBE, ALD, evaporation, sputtering or the like. As shown in an embodiment in FIG. 11, layers 6 preferably further comprise a plurality of sub-layers, such as tunneling layers 6A1, storage layers 6A2, barrier layers 6A3, wherein the tunneling layers 6A1 compose $SiO_2$ or high-k material, wherein the high-k materials include, but are not limited to nitride (such as SiN, AlN, TiN), metal oxides (mainly subgroup and lanthanide metal element oxides, such as MgO, $Al_2O_3$, $Ta_2O_5$, $TiO_2$, ZnO, $ZrO_2$, $HfO_2$, $CeO_2$, $Y_2O_2$, $La_2O_3$), nitrogen oxides (e.g., HfSiON), perovskite phase oxide (e.g. $PbZr_xTi_{1-x}O_3$ (PZT), $Ba_xSr_{1-x}TiO_3$ (BST)), etc., and tunneling layers 6A1 may be monolayer or multilayer stacked structure of the above materials. Memory layers 6A2 are dielectric material with charge trapping capabilities, e.g., SiN, HfO, ZrO, etc., and combinations thereof, also may be the monolayer structure or multilayer stacked structure of the above materials. Barrier layers 6A3 may be monolayer or multi layer stacked structure of dielectric materials such as silicon oxide, aluminum oxide, hafnium oxide and the others. Gate conductive layers 6B may be polysilicon, a polycrystalline silicon-germanium, or metals, wherein the metals may comprise metal elements such as Co, Ni, Cu, Al, Pd, Pt, Ru, Re, Mo, Ta, Ti, Hf, Zr, W, Ir, Eu, Nd, Er, La and the others, or alloys of these metals and the nitrides of these metals, and gate conductive layers 6B may also be doped with C, F, N, O, B, P, As and other elements to adjust the work function. In an embodiment, nitride barrier layers (not shown) are preferably formed between the gate dielectric layers 6A and gate conductive layers 6B by PVD, CVD, ALD and other conventional processes, the material of barrier layers is $M_xN_y$, $M_xSi_yN_z$, $M_xAl_yN_z$, $M_aAl_xSi_yN_z$, wherein the M is Ta, Ti, Hf, Zr, Mo, W, or other elements. Likewise, layers 6B may be a monolayer structure, or also be a multilayer stacked structure.

Figure 10:
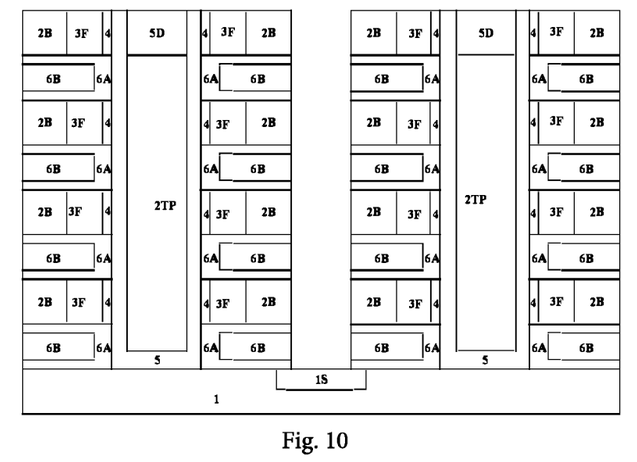

As shown in FIG. 10, a plurality of common source regions 1S are formed in the substrate 1. Source regions 1S can be formed by doping with ionic injected, and preferably by forming metal silicides (not shown) on the surface. The metal silicides are such as $NiSi_{2-y}$, $Ni_{1-x}Pt_xSi_{2-y}$, $CoSi_{2-y}$, or $Ni_{1-x}Co_xSi_{2-y}$, wherein the x is greater than 0 and less than 1, and the y is greater than or equal to 0 and less than 1.

The finally obtained device shown in FIG. 10 includes, a plurality of channel layers 5 projecting perpendicularly from the substrate 1; a plurality of interlayer insulating layers 2A and a plurality of gate stack structures 6A/6B alternately laminating along the channel layers 5; wherein, a plurality of floating gates 3F and optional floating gate spacer layers 4 are between interlayer insulating layers 2A and the sidewalls of channel layers 5. As shown in an enlarged fragmentary view of FIG. 11, when a control voltage is applied to the gate conductive layers 6B of gate stack structures 6, the electrical potential on floating gates 3F will rise, since the electrostatic coupling will accelerate the formation of source-drain regions of the memory cell. The induction efficiency and strength of source-drain regions are effectively improved, and the source-drain resistance of memory cells are reduced, thereby increasing the read current and read speed of the memory array.

Figure 12:
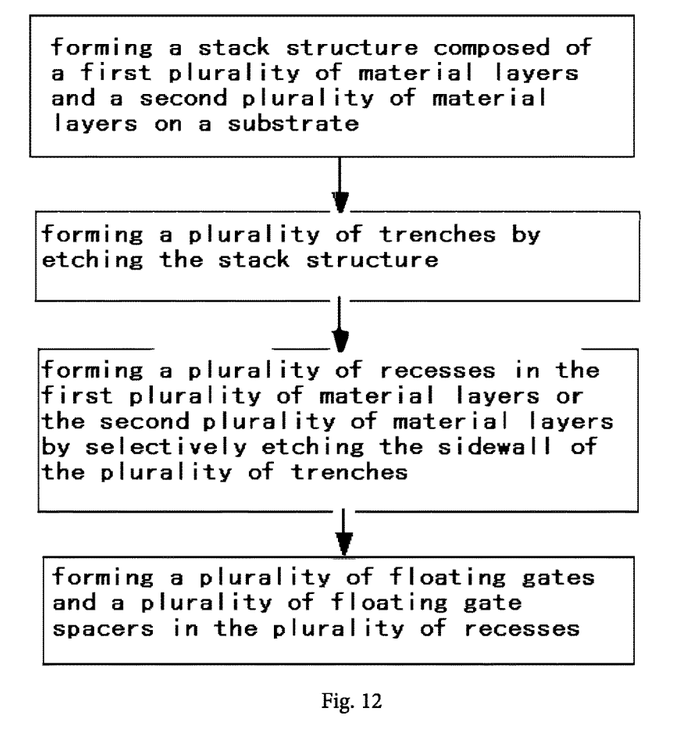
FIG. 12 is a schematic flow diagram of the 3-D semiconductor device manufacturing method in accordance with an embodiment of the present invention.

The flow chart of a method of manufacturing the semiconductor device is shown in FIG. 12. It is worthily noted that the flow chart is only a preferred embodiment of the invention, and as long as there are floating gate 3F between the gates 6B, the present invention can be implemented.

Figure 13:
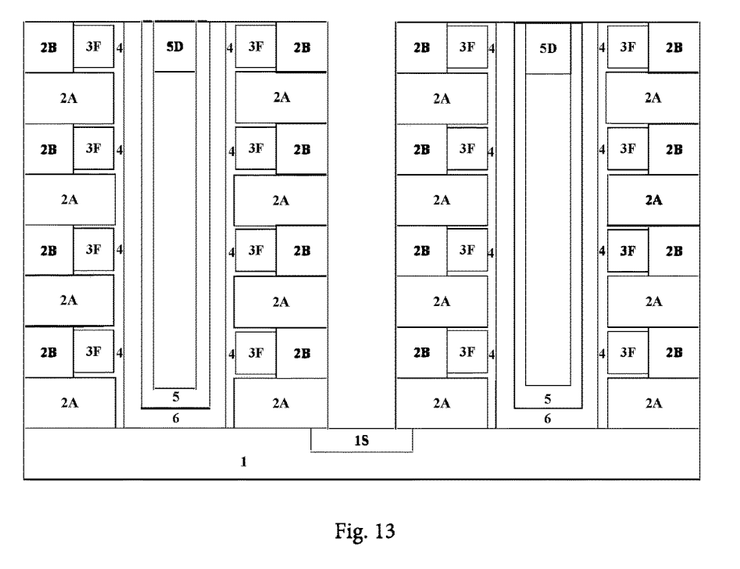
FIG. 13 is a sectional view of a 3-D semiconductor device according to another embodiment of the present invention.

For example, another preferred embodiment of the present invention not shown in FIGS. 1 to 11 may comprise the following steps:

depositing a stacked structure composed of a first and a second plurality of material layers 2A/2B as shown in FIG. 1, wherein the material of first plurality of material layers is the material of gate conductive layers 6B described above, e.g., comprising doped semiconductors or conductive structures, such as polysilicon, amorphous silicon, microcrystalline silicon, or metals for controlling the gates, and the other layers 2B constitute the interlayer insulating layers;

defining a plurality of channel regions by etching as shown in FIG. 2;

etching-back the second plurality of material layers 2B in order to form a plurality of recesses 2R as shown in FIG. 3;

forming floating gates 3F and floating gate spacers 4 similar to those shown in FIGS. 4 and 5, except that firstly forming floating gate spacers 4 for covering the bottom and sides of recesses 2R, i.e. simultaneously covering the layers 2A, and then filling and depositing a floating gate material layer 3 on the layers 4 and etching to form the floating gates 3F; then more preferably, continuing to deposit floating gate spacers 4 on sidewalls of floating gates 3F and layers 2A, so that the floating gates 3F and layers 2A are entirely wrapped by layers 4, wherein layer 4 acts as gate insulating layer of gate layers 2A; alternatively, a gate insulating layer (not shown) may be deposited on the sidewalls of gates 2A similar to layers 6A; then FIG. filling the channel layers 5 and forming drain regions 5D as shown in FIGS. 6 and 7; subsequently, forming sources 1S as shown in FIG. 10. The resulting device structure is shown in FIG. 13.

Further, in other embodiments of the present invention, when the floating material layer 3 is deposited as shown in FIG. 4, the floating gates are formed not only in the device memory cell regions as shown in FIG. s, but also in the (drivers) select cell regions. In other words, the gate structures 3F/4 of the invention will be located in the memory cells and/or select transistors.

In accordance with the 3-D semiconductor device and manufacturing method of the present invention, floating gates are implanted in the vertical channel sidewalls, thus controlling the on/off of source-drain regions induced on the vertical channel sidewalls by coupling between the gate electrodes and the floating gates. The induction efficiency and strength of source-drain regions are effectively improved, while the source-drain resistance of memory cells is reduced, thereby increasing the read current and read speed of memory array.

Although the present invention is descried with one or more exemplary embodiments, one skilled in the art will recognize that various appropriate changes and equivalents of the device structures can be made without departing from the scope of the present invention. Furthermore, a great deal of modifications of specific situation or materials can be made to the disclosed enlightenment without departing from the scope of the present invention. Thus, the intent of the present invention is not limited to the disclosed illustrative examples for implementing the best embodiments. The disclosed device structures and the method of manufacturing the same will include all the exemplary embodiments within the scope of the invention.

What is claimed is:

1. A 3-D semiconductor device comprising a plurality of memory cells and a plurality of selection transistors, each of said plurality of memory cells comprises: a channel layer, distributed along a direction perpendicular to a substrate surface; a plurality of inter-layer insulating layers and a plurality of gate stack structures, alternately laminated along a sidewall of the channel layer; a plurality of floating gates, located between the plurality of inter-layer insulating layers and the sidewall of the channel layer; a plurality of drains, located at the top of the channel layer; and a source, located in the said substrate and between every two adjacent memory cells of the said plurality of memory cells; and further comprising a discrete floating gate spacer between each of the plurality of the floating gates and the channel layer.

2. The 3-D semiconductor device of claim 1, wherein, the cross-sectional shape of the channel layer parallel to the substrate surface comprises geometric shapes selected from rectangular, square, diamond, circular, semi-circular, elliptical, triangular, pentagonal, hexagonal, octagonal and the combinations thereof, and includes those selected from solid geometry, hollow annular geometry, or a combination of a hollow annular peripheral layer and a central insulating layer as a result of revolution of the said geometric shapes.

3. The 3-D semiconductor device of claim 1, wherein, each of said plurality of gate stack structures includes a gate dielectric layer and a gate conductive layer.

4. The 3-D semiconductor device of claim 3, wherein, the gate dielectric layer further comprises a tunneling layer, a storage layer, and a barrier layer.

5. The 3-D semiconductor device of claim 3, wherein, a barrier layer of nitride between the gate dielectric layer and the gate conductive layer is further included.

6. The 3-D semiconductor device of claim 1, wherein, the plurality of floating gates comprise a monolayer or multi-layer structure of floating gate material layer; the material of the floating gate material layer comprises semiconductor materials or conductive materials, or dielectric materials with charge trapping capability.

7. The 3-D semiconductor device of claim 1, wherein, each top of the plurality of sources comprises a metal silicide.

8. The 3-D semiconductor device of claim 1, wherein, said plurality of selection transistors may or may not include a floating gate.

* * * * *